US007262125B2

(12) United States Patent
Wongsenakhum et al.

(10) Patent No.: US 7,262,125 B2
(45) Date of Patent: Aug. 28, 2007

(54) METHOD OF FORMING LOW-RESISTIVITY TUNGSTEN INTERCONNECTS

(75) Inventors: Panya Wongsenakhum, Fremont, CA (US); Aaron R. Fellis, Sunnyvale, CA (US); Kaihan A. Ashtiani, Sunnyvale, CA (US); Karl B. Levy, Los Altos, CA (US); Juwen Gao, Fremont, CA (US); Joshua Collins, Sunnyvale, CA (US); Junghwan Sung, Los Altos, CA (US); Lana Hiului Chan, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/815,560

(22) Filed: Mar. 31, 2004

(65) Prior Publication Data

US 2004/0202786 A1 Oct. 14, 2004

Related U.S. Application Data

(63) Continuation-in-part of application No. 10/649,351, filed on Aug. 26, 2003, which is a continuation-in-part of application No. 09/975,074, filed on Oct. 9, 2001, now Pat. No. 6,635,965, application No. 10/815,560, and a continuation-in-part of application No. 10/690,492, filed on Oct. 20, 2003.

(60) Provisional application No. 60/292,917, filed on May 22, 2001, provisional application No. 60/441,834, filed on Jan. 21, 2003.

(51) Int. Cl.
*H01L 21/4763* (2006.01)

(52) U.S. Cl. ............... 438/618; 438/685; 438/648; 257/E21.295; 257/E23.145; 257/E21.59

(58) Field of Classification Search ............... 438/648, 438/679–681, 685, FOR. 403, FOR. 405; 257/E21.295, E23.145, E21.59
See application file for complete search history.

(56) References Cited

U.S. PATENT DOCUMENTS

| 4,804,560 A | 2/1989 | Shioya et al. |
| 5,028,565 A | 7/1991 | Chang et al. |

(Continued)

FOREIGN PATENT DOCUMENTS

WO    WO01/27147    4/2001

OTHER PUBLICATIONS

George et al., "Surface Chemistry for atomic Layer Growth", J. Phys. Chem, 1996, vol. 100, No. 31, pp. 13121-13131.

(Continued)

*Primary Examiner*—Michelle Estrada
(74) *Attorney, Agent, or Firm*—Beyer Weaver LLP

(57) ABSTRACT

Methods and apparatus for preparing a low-resistivity tungsten film on a substrate are provided. Methods involve the formation of a tungsten nucleation layer on a substrate using pulsed nucleation layer (PNL) techniques and depositing a bulk tungsten layer thereon. Methods for forming the tungsten nucleation layer involve the use of a boron-containing species, a tungsten-containing precursor, and optionally, a silane. The methods described are particularly useful for applications where thin, low resistivity films are desired, such as interconnect applications.

32 Claims, 5 Drawing Sheets

U.S. PATENT DOCUMENTS

| | | | |
|---|---|---|---|
| 5,227,329 A * | 7/1993 | Kobayashi et al. | 438/301 |
| 5,250,329 A | 10/1993 | Miracky et al. | |
| 5,326,723 A | 7/1994 | Petro et al. | |
| 5,391,394 A | 2/1995 | Hansen | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,956,609 A | 9/1999 | Lee et al. | |
| 6,001,729 A * | 12/1999 | Shinriki et al. | 438/625 |
| 6,017,818 A * | 1/2000 | Lu | 438/653 |
| 6,066,366 A | 5/2000 | Berenbaum et al. | |
| 6,099,904 A * | 8/2000 | Mak et al. | 427/253 |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,245,654 B1 | 6/2001 | Shih et al. | |
| 6,265,312 B1 | 7/2001 | Sidhwa et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,355,558 B1 * | 3/2002 | Dixit et al. | 438/642 |
| 6,551,929 B1 * | 4/2003 | Kori et al. | 438/685 |
| 6,566,250 B1 | 5/2003 | Tu et al. | |
| 6,566,262 B1 | 5/2003 | Rissman et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,740,585 B2 | 5/2004 | Yoon et al. | |
| 6,844,258 B1 | 1/2005 | Fair et al. | |
| 6,861,356 B2 | 3/2005 | Matsuse et al. | |
| 6,962,873 B1 | 11/2005 | Park | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0090796 A1 | 7/2002 | Desai et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2004/0044127 A1 | 3/2004 | Okubo et al. | |
| 2004/0206267 A1 | 10/2004 | Sambasivan et al. | |

OTHER PUBLICATIONS

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

Levy e al., "Deposition of Tungsten Nitride", Novellus Systems, Inc., filed Oct. 20, 2003, U.S. Appl. No. 10/690,492, pp. 1-42.

Lee et al., "Method for Reducing Tungsten Film Roughness and Improving Step Coverage", Novellus Systems, Inc., filed Aug. 26, 2003, U.S. Appl. No. 10/649,351, pp. 1-40.

Fair et al., "Selective Refractory Metal and Nitride Capping", Novellus Systems, Inc., filed Nov. 8, 2004, U.S. Appl. No. 10/984,126, pp. 1-22.

U.S. Office Action mailed Nov. 8, 2004, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, Application No. Not yet assigned, pp. 1-26.

U.S. Office Action mailed May 17, 2006, from U.S. Appl. No. 10/984,126.

* cited by examiner

METHOD OF FORMING LOW-RESISTIVITY TUNGSTEN INTERCONNECTS

CROSS-REFERENCE TO RELATED APPLICATIONS

This application is a continuation-in-part of U.S. patent application Ser. No. 10/649,351, filed on Aug. 26, 2003, titled "Method for Reducing Tungsten Film Roughness and Improved Step Coverage," by Sang-Hyeobet Lee, et al., which is in turn a continuation-in-part of U.S. patent application Ser. No. 09/975,074 (now U.S. Pat. No. 6,635,965) filed Oct. 9, 2001, which in turn claims priority from U.S. Provisional Patent Application No. 60/292,917, file May 22, 2001; and this application is also continuation-in-part of U.S. patent application Ser. No. 10/690,492, filed on Oct. 20, 2003, titled "Deposition of Tungsten Nitride," by Karl B. Levy, et al, which claims priority from prior U.S. Provisional Patent Application No. 60/441,834 filed Jan. 21, 2003. This application is also related to U.S. patent application Ser. No. 10/435,010, filed on May 9, 2003, titled "Selective Refractory Metal and Nitride Capping," by Havemann, Robert H., et al. Each of these applications is incorporated herein by reference in its entirety for all purposes.

BACKGROUND

This invention relates to methods for preparing tungsten films on integrated circuits, for example. The invention is particularly useful for applications that require thin tungsten films having low electrical resistance.

The deposition of tungsten films using chemical vapor deposition (CVD) techniques is an integral part of many semiconductor fabrication processes. The tungsten films may be used to produce low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the bulk layer is formed by the reduction of tungsten hexafluoride ($WF_6$) with hydrogen ($H_2$) on the growing tungsten layer. The bulk layer is generally deposited more rapidly than the nucleation layer, but cannot be produced easily and reliably without first forming the nucleation layer.

Various deposition methods can be used to form a thin tungsten nucleation layer. These include a CVD technique and a pulsed nucleation layer (PNL) technique. In a CVD technique, the $WF_6$ and reducing gas (e.g., $SiH_4$ and/or $H_2$) are simultaneously introduced into the reaction chamber. This produces a continuous chemical reaction of mixed reactant gases that continuously forms tungsten film on the substrate surface. In a typical example, CVD nucleation layers are deposited from $WF_6$-SiH4 with an argon carrier gas. In some instances, CVD nucleation performance is enhanced by the presence of $H_2$ in carrier gas mixture. Note that the $WF_6$-$SiH_4$ reaction is much faster than the $WF_6$-$H_2$ reaction due to lower activation energy and greater reactivity.

In a PNL technique, pulses of the reducing agent, purge gases, and tungsten-containing precursors are sequentially injected into and purged from the reaction chamber. The process is repeated in a cyclical fashion until the desired thickness is achieved. PNL is similar to atomic layer deposition techniques reported in the literature. PNL is generally distinguished from atomic layer deposition (ALD) by its higher operating pressure range (greater than 1 Torr) and its higher growth rate per cycle (greater than 1 monolayer film growth per cycle). In the context of this invention, PNL broadly embodies any cyclical process of sequentially adding reactants for reaction on a semiconductor substrate. Thus, the concept embodies techniques conventionally referred to as ALD.

Tungsten processes should also produce films with low resitivity. Advancing technology requires that tungsten electrical connects be increasing thin yet maintain very low resistance. Hence, it is critical that tungsten deposition process provide tungsten having very low resistivity. For many semiconductor fabrication applications, the tungsten film should have a resistivity of about 30 $\mu\Omega$-cm or less. It is also essential that the deposited tungsten integrate well with other components of the device. Hence it should have good adhesion to underlying materials in the device.

What are therefore needed are improved methods for forming low resistivity tungsten films.

SUMMARY

The present invention addresses this need by providing improved methods for preparing a low resistivity tungsten film. In particular, methods involve (a) positioning the substrate in a reaction chamber, (b) exposing the substrate to a boron-containing species to form a boron-containing layer, (c) contacting the boron-containing layer with a tungsten-containing precursor to form a tungsten nucleation layer and (d) depositing a bulk tungsten layer over the tungsten nucleation layer to form the tungsten film. Methods following this sequence can produce tungsten films with a sheet resistance (resistivity) of 15 $\mu\Omega$-cm or less. In many applications, the resultant tungsten film has a total thickness of between about 20 Angstroms and about 1,000 Angstroms, with many applications requiring a film no greater than about 500 Angstroms. Typically, the thickness of the tungsten nucleation layer is between about 10 Angstroms and about 30 Angstroms. In some embodiments, (b) and (c) are repeated one or more times prior to (d) to achieve a desired tungsten nucleation layer thickness.

In certain specific embodiments, methods include purging the reaction chamber between exposures of the substrate to reactant species, in particular after (b) and before (c), and after (c) and before (d). Purging the reaction chamber typically involves flowing a carrier gas, such as argon, hydrogen, nitrogen and/or helium, through the reaction chamber (without flowing the reactant gas). In a typical example, the substrate temperature during (b) and (c) is maintained between about 200 degrees Celsius and about 475 degrees Celsius and the reaction chamber pressure during (b) and (c) is maintained between about 1 Torr and about 350 Torr.

Various boron-containing species may be used in (b). In many embodiments, the borane is diborane ($B_2H_6$). The boron-containing layer that is formed in (b) typically has a thickness of between about 1.5 and 30 Angstroms, and preferably between about 3 and 15 Angstroms. Any suitable tungsten-containing precursor may be used in (c). In many embodiments, the tungsten-containing precursor is $WF_6$, $WCl_6$, $W(CO)_6$, or a combination of thereof. The tungsten-containing precursor is preferably provided to contact the boron-containing layer for a time period sufficient to consume substantially all of the boron in the boron-containing layer.

In some embodiments, a "dual divert" method is used to provide one or more of the reactant gases into the reaction chamber. Such methods involve stabilizing a flow of the reactant species (e.g., diborane or tungsten hexafluoride) by diverting the flow to an exhaust port without passing through the reaction chamber and then pressurizing a gas line leading to the reaction chamber by flowing the reactant species to the gas line prior to allowing the species to enter the reaction chamber. Typically, the reactant gases are provided in a dilution gas, which may vary in type depending upon the reactant gas being used.

Once the tungsten nucleation layer is formed, a bulk tungsten layer is deposited to form the tungsten film. Typically, this bulk tungsten deposition is accomplished using a CVD process. Frequently, though not necessarily, the same tungsten-containing precursor is used for depositing the nucleation layer and the bulk layer.

In some embodiments, forming the nucleation layer involves exposing the substrate to additional reactants prior to (b). In one preferred embodiment, the method involves exposing the substrate to a silane and thereafter contacting the substrate with a tungsten-containing precursor to form a portion of the tungsten nucleation layer, prior to (b). Thus, the overall nucleation layer deposition involves exposing the substrate to a silane, a tungsten precursor, a boron-containing compound, and a second tungsten precursor. The tungsten-containing precursor used for the preliminary step can be the same chemical compound as the tungsten-containing precursor in (c). Typically, the reaction chamber is purged prior to the addition of each new reactant gas. Examples of suitable silanes include silane ($SiH_4$), disilane, and tetrasilane.

In embodiments, it may desirable to form a thicker tungsten nucleation layer by repeating the entire sequence of exposures (a silane, a tungsten precursor, a boron-containing compound, and a tungsten-precursor). In other cases, only the first two operations are repeated (exposure to a silane and a tungsten precursor) prior to the final operations of boron deposition and exposure to a tungsten precursor.

These and other features and advantages of the invention will be described in more detail below with reference to the associated drawings.

BRIEF DESCRIPTION OF THE DRAWINGS

The following detailed description can be more fully understood when considered in conjunction with the drawings in which.

DETAILED DESCRIPTION OF A PREFERRED EMBODIMENT

Introduction

Figure 1:
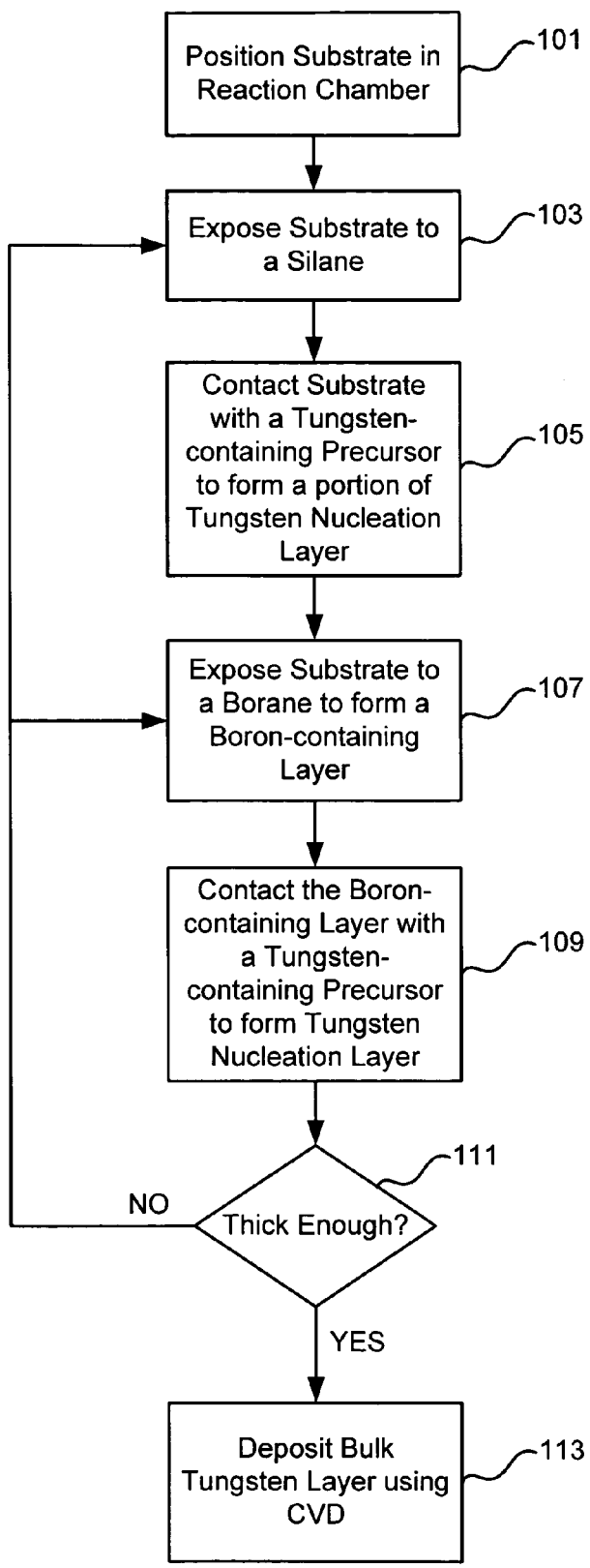
FIG. 1 is a flowchart summarizing processing stages in example implementations of the invention.

In the following description, numerous specific details are set forth in order to provide a thorough understanding of the present invention, which pertains to forming thin tungsten films. Preferred methods involve pulsed nucleation layer (PNL) deposition techniques, which will be described in detail below. Modifications, adaptations or variations of specific methods and or structures shown and discussed herein will be apparent to those skilled in the art and are within the scope of this invention.

The present invention involves forming a tungsten film by way of a tungsten nucleation layer. In general, a nucleation layer is a thin conformal layer which serves to facilitate the subsequent formation of a bulk material thereon. PNL techniques involve cycles of substrate exposure in which reactants are sequentially injected into and removed from a reaction chamber. The nucleation layer may be formed using one or more PNL cycles. Additional discussion regarding PNL type processes can be found in the related U.S. patent applications Ser. Nos. 10/649,351 and 10/690,492, which were previously incorporated herein by reference.

While efficient tungsten deposition processes require tungsten nucleation layers, these layers typically have higher electrical resistivities than the bulk tungsten layers. Thus, to keep the electrical resistance of the overall tungsten film (tungsten nucleation layer and bulk tungsten) low, the tungsten nucleation layer should be kept as thin as possible. On the other hand, the tungsten nucleation should be sufficiently thick to fully cover the underlying substrate to support high quality bulk deposition. So, to achieve an optimal thickness, the tungsten nucleation layer may be formed in one or more PNL deposition cycles. It has been found that the tungsten nucleation layer should typically have a thickness of between about 10 and 30 Angstroms.

Generally in methods of this invention the substrate is exposed to a boron-containing species, and then exposed to a tungsten-containing precursor to form the tungsten nucleation layer. For some applications the tungsten nucleation layer is not thick enough after one such PNL cycle and another cycle can be performed before the bulk tungsten layer is deposited. That is, the substrate is exposed again to a boron-containing species, followed by exposure to a tungsten-containing precursor to form another portion of tungsten nucleation layer. Any number of PNL cycles can be performed in this manner as needed prior to the bulk tungsten deposition.

In another preferred approach, the substrate is initially exposed to a silane (e.g., $SiH_4$), followed by a tungsten-containing precursor to form a portion of the tungsten nucleation layer. Thereafter the partial nucleation layer is exposed to a boron-containing species and then to a tungsten-containing precursor to form the remaining portion of the tungsten nucleation layer (a four step PNL cycle). This entire four-step PNL cycle can also be repeated to form a desired tungsten nucleation layer thickness. In a variation of the process, the first two steps of the cycle (sequential exposure to silane and the tungsten-containing precursor) are repeated one or more time prior to contact with boron-containing compound. In another variation, the last two steps of the cycle (sequential exposure to the boron-containing compound and the tungsten-containing precursor) can be repeated one or more times after the first two steps are completed. Of course, the first two steps could be repeated and then the second two steps could be repeated. In short, any combination of these PNL cycle steps can be performed to achieve a desired tungsten nucleation layer thickness prior to bulk tungsten deposition. Aspects of some of these embodiments will now be described in more detail.

Process

FIG. 1 is a flow chart depicting one process flow in accordance with certain embodiments of the present invention. The depicted process involves a four-step nucleation layer deposition process. As indicated, in some embodiments, a simpler process for depositing the nucleation layer may be used. For instance, as described previously, some processes involve only operations 101 (positioning the substrate), 107 (exposing the substrate to a borane), 109 (contacting the boron-containing layer with a tungsten-containing precursor) and 113 (forming the bulk tungsten layer). Thus, the flow chart of FIG. 1 illustrates, in itself, only one specific embodiment and the invention is not limited to this embodiment.

Initially, a substrate is provided and positioned in a reaction chamber as indicated by a process block 101. As mentioned previously, in many embodiments the substrate is a partially fabricated electronic device (e.g., a partially fabricated integrated circuit). Some specific applications of the invention will be described later.

Next, as indicated by a process block 103, the substrate is exposed to a silane. Silane and related compounds have been found to adsorb well to metal nitride surfaces such as titanium nitride and tungsten nitride used as barrier layer materials in some integrated circuit applications. Any suitable silane or silane derivative may be used, including organic derivative of silanes. In some preferred embodiments, the silane is $SiH_4$. It is generally understood that silanes adsorb on the substrate surface in a self-limiting manner so as to create nominally a monolayer of silane species. Thus, the amount of adsorbed species is largely independent of the silane dosage. Substrate temperatures are generally within the allowed ranges for integrated circuit manufacturing processes; i.e., preferably between about 200 and 475 degrees Celsius. Chamber pressure can vary broadly, between about 1 and 350 Torr. In a particular application, for example, chamber pressures were fixed around 40 Torr Exposure time will vary depending in part upon dosages and chamber conditions. Preferably, the substrate is exposed until the surface is sufficiently and evenly covered with at least a saturated layer of silane species. Note that the silane may be provided alone or with a carrier gas. Examples of carrier gases include argon and argon-hydrogen mixtures.

Once the substrate is sufficiently covered with silane species, the flow of silane species to the reaction chamber is stopped and the reaction chamber is purged with a carrier gas such as argon, hydrogen, nitrogen or helium. The gas purge clears the regions near the substrate surface of residual gas reactants that could react with fresh gas reactants for the next reaction step.

Referring back to FIG. 1, the next operation 105 involves contacting the substrate with a tungsten-containing precursor to form a portion of the tungsten nucleation layer. Any suitable tungsten-containing precursor may be used. In preferred embodiments the tungsten-containing precursor is one of $WF_6$, $WCl_6$ and $W(CO)_6$. The tungsten-containing precursor is typically provided in a dilution gas, such as argon, nitrogen, hydrogen, or a combination thereof. The substrate temperature is preferably between about 200 and 475 degrees Celsius and chamber pressure is preferably between about 1 and 350 Torr. Tungsten-containing precursor dosage and substrate exposure time will vary depending upon a number factors. In general, the substrate is preferably exposed until the adsorbed silane species is sufficiently consumed by reaction with the tungsten-containing precursor to produce a portion of the tungsten nucleation layer. Thereafter, the flow of tungsten-containing precursor to the reaction chamber is stopped and the reaction chamber is purged with a carrier gas such as argon, hydrogen, nitrogen or helium.

The resulting portion of tungsten nucleation layer is typically between about 5 and 40 Angstroms. As described previously, the tungsten nucleation layer should be sufficiently thin so as to not unduly increase the overall tungsten film, but sufficiently thick so as to support a high quality bulk tungsten deposition. It has been demonstrated for purposes of many semiconductor wafer applications that an appropriate thickness of the tungsten nucleation layer is between about 10 and 30 Angstroms, more preferably between about 20 and 30 Angstroms. If the is tungsten deposited any thinner the wafer may have a "splotchy" appearance from the uneven tungsten distribution. While the thickness of the nucleation layer can be controlled by many different mechanisms, one approach involves repeating operations 103 and 105, one or more times. Note that this repetition is shown only implicitly in FIG. 1.

Referring again to FIG. 1, the substrate is next exposed to a boron-containing species to form boron-containing layer. See process operation 107. Note that the boron-containing layer may contain other chemical species or impurities from the boron-containing species itself or from residual gases in the reaction chamber. Any suitable boron-containing species may be used, including borane ($BH_3$), diborane ($B_2H_6$), triborane, etc. Examples of other boron-containing species include boron halides (e.g., $BF_3$, $BCl_3$) with hydrogen. Unlike the PNL silane deposition operation 103, boron deposition is not a self-limiting adsorption. Rather, the boron-containing species reacts on the substrate surface to decompose into a boron film or layer. The reaction can proceed as long as the substrate is continually exposed to boron-containing species. However, to ensure that a limited amount of tungsten is actually formed in the subsequent step, the diborane deposition is preferably limited to a thickness of between about 3 and 15 angstroms. This may correspond to about one or two monolayers of boron.

Since the boron-containing layer formation is not of a self-limiting nature, dosage, exposure time and substrate temperatures should be adjusted correspondingly. The boron-containing species is typically provided in a dilution gas, such as argon, nitrogen, hydrogen, silane or a combination thereof. In a typical chamber setup for a six-wafer processing (200 mm each), the substrate temperature is between about 200 and 475 degrees Celsius and the chamber pressure is between about 1 and 350 Torr. Frequently,. diborane is provided from a diluted source (e.g., 5% diborane and 95% nitrogen). Diborane may be delivered the reaction chamber using other or additional carrier gases such as nitrogen, argon, hydrogen, and/or silane.

Once the boron-containing layer is deposited to a sufficient thickness, the flow of boron-containing species to the reaction chamber is stopped and the reaction chamber is purged with a carrier gas such as argon, hydrogen, nitrogen or helium.

Returning again to FIG. 1, in an operation 109 the boron-containing layer is contacted with a tungsten-containing precursor to form another portion of the tungsten nucleation layer. Reaction conditions are similar to those of the previous tungsten containing precursor exposure operation 105 and the same tungsten-containing precursor is typically used. As with operation 105, the tungsten-containing precursor is typically provided in a dilution gas, such as argon, nitrogen, hydrogen, or a combination thereof. The substrate temperature is preferably between about 200 and 475 degrees Celsius and chamber pressure is preferably between about 1 and 350 Torr. Tungsten-containing precursor dosage and substrate exposure time will vary depending upon a number factors. In general, the substrate is preferably exposed until the boron-containing layer is sufficiently consumed by reaction with the tungsten-containing precursor.

Once the boron is sufficiently consumed and another portion of the tungsten nucleation layer is formed, the flow of tungsten-containing precursor to the reaction chamber is stopped and the reaction chamber is purged with a carrier gas such as argon, hydrogen, nitrogen or helium.

Referring back to FIG. 1, a decision operation 111 determines whether the tungsten nucleation layer is sufficiently thick. As described previously, in a number of integrated circuit applications the tungsten nucleation layer is preferably between about 10 and 30 Angstroms. Under typical conditions, implementation of operations 103, 105, 107 and 109 (one four-step PNL cycle) has been found to deposit a tungsten nucleation layer with about 10 Angstroms. Thus, if the goal is to form a nucleation layer of at least 20 Angstroms thickness, one or more additional PNL cycles may be used to complete formation of the nucleation layer. This can be done either by re-implementing operations 103 and 105 at least once more, re-implementing operations 107 and 109 at least once more, or by re-implementing all of operations 103, 105, 107 and 109 at least once more until the tungsten nucleation layer is between about 20 and 30 Angstroms thick.

If at decision 111 the tungsten nucleation layer has reached the desired thickness, the tungsten nucleation layer is fully formed and next a bulk tungsten layer is deposited thereon. See process block 113. In many embodiments the bulk tungsten is deposited using a CVD process since CVD has been found to rapidly produce low resistivity films. Any suitable CVD process may be used with any suitable tungsten-containing precursor. In some embodiments the same tungsten-containing precursor used in the PNL processes for forming the tungsten nucleation layer is use—typically one of $WF_6$, $WCl_6$ and $W(CO)_6$. Frequently, the CVD process is performed using a mixture of molecular hydrogen and one or more of these precursors. In other embodiments, the CVD process may employ a tungsten precursor together with silane or a mixture of hydrogen and silane or a mixture of hydrogen and borane (such as diborane). Non-CVD process can also be employed to form the bulk layer. These include ALD/PNL and physical vapor deposition (PVD).

The bulk tungsten can be deposited to any thickness. Tungsten interconnect lines for integrated circuit applications may have a total thickness (tungsten nucleation layer and bulk tungsten) of between about 20 and 1,000 Angstroms. For a typical bit line, the total tungsten film thickness is typically no greater than about 500 Angstroms. The resulting tungsten film will preferably have a resistivity of no greater than about 30 $\mu\Omega$-cm (more preferably no greater than about 15 $\mu\Omega$-cm and most preferably not greater than about 10 $\mu\Omega$-cm), depending upon the number and type of PNL cycles used.

After the tungsten film is deposited to a sufficient thickness, the process flow of FIG. 1 is complete. Note that the process parameters can be varied in order to influence the thickness of the nucleation layer formed at any particular cycle of the process. These parameters include the deposition temperature, the concentration or doses of the various materials delivered to the substrate, and the presence or absence of hydrogen. Generally, higher deposition temperatures translate to thicker tungsten films. However, some applications require that a lower temperature be used to ensure that the underlying structures created during the fabrication process are not damaged. Obviously, processes that employ relatively high concentrations or doses of the reactants are more likely to produce thicker nucleation layers. Note however that all pure component reactants except the boranes are absorbed on the surface of a substrate in a self-limiting fashion. In other words, at a certain point after which no further reactant can be absorbed on the surface, any additional dose or higher concentration will not translate into more tungsten being formed. Therefore, it is within only a relatively narrow window of doses or concentrations that an appreciable difference can be observed. Finally, with respect to the presence or absence of hydrogen, generally it has been found that when hydrogen is used together with the other reactant gases, tungsten nucleation material is deposited more thickly.

It is also worth noting that when hydrogen is used with tungsten hexafluoride, the process of applying tungsten hexafluoride to the substrate surface is not self-limiting. That is, tungsten and hydrogen will continue to react in a manner of a CVD process and the tungsten will continually build to thicker and thicker proportions. Thus, some care should be chosen in determining how much tungsten hexafluoride to deliver to the substrate when it is mixed with hydrogen gas. The same is true of the borane material, regardless of whether or not it is mixed with hydrogen. As indicated, the boranes will continue to react to the surface to build thicker and thicker layers of borane. So to summarize, when a borane is delivered to the substrate and when tungsten hexafluoride together with hydrogen is delivered to the substrate, the quantities of the borane and the tungsten hexafluoride must be carefully controlled to ensure that the amount of deposited material is not too great. Because the nucleation layer is formed via PNL process, each successive component delivered to the reaction chamber is generally delivered free of other reactants used in subsequent steps of a PNL cycle—except as indicated above (e.g., silane may be provided with diborane in some embodiments).

In a variation of the above process, a partial or complete tungsten nucleation layer is treated with a plasma after one of the dose operations, e.g., after dosing with a tungsten precursor. In one example, the plasma is generated from hydrogen, helium, nitrogen, argon, or a mixture of two or more of these components. The purge operation typically follows the plasma treatment. A plasma treatment may help to drive impurity out of the film (e.g., silicon or fluorine) that could reduce resistivity.

In some cases, a purpose of the plasma treatment is to introduce carbon, nitrogen or a specified dopant atom into the tungsten nucleation layer. In such situations, a nitrided or carbided tungsten nucleation layer can result. A nitrided nucleation layer can provide improved barrier properties. Carbon can be provided from various sources including, for example, carbon tetrafluoride and hexafluoroethane. The presence of carbon in the nucleation layer can further reduce resistivity of the tungsten film. In this process, various plasma conditions can be employed. In one example, the plasma is generated from a single radio frequency source (e.g., 13.56 MHz applied to a showerhead or pedestal in the deposition reactor). In another example, a multiple source system is employed; e.g., a 13.56 MHz source provides power to the showerhead and a 450 kHz source provides power to the pedestal, or vice-versa. Typically, the applied frequency range will be between about 450 kHz and 100 MHz.

Other variations of the above process involve rearrangement of certain steps. For example, as explained in U.S. patent application Ser. No. 10/649,351 (previously incorporated by reference), the tungsten nucleation process flow may proceed in the following order: (a) boron precursor, (b) tungsten precursor, (c) a silane, and (d) tungsten precursor. And of course the process can repeated as necessary to form a nucleation layer of the desired thickness. In another variation, the process begins with a exposure to a tungsten precursor. For example, the nucleation process flow may proceed in the following order: (a) tungsten precursor, (b) a silane, (c) a tungsten precursor, (d) a boron precursor, and (e) a tungsten precursor (e.g., $WF_6$, $SiH_4$, $WF_6$, $B_2H_6$, $WF_6$).

Apparatus

The methods of the invention may be carried out in various types of deposition apparatus available from various vendors. Examples of suitable apparatus include a Novellus Concept-1 Altus, a Concept 2 Altus, a Concept-2 ALTUS-S, a Concept 3 Altus deposition system, or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

In one example, after a first thickness of tungsten deposited, the wafer is moved to a second deposition station and a new wafer is moved into place on the first station. The wafers may be indexed from one deposition station to the next to enable parallel wafer processing after one or more repetitions of the cycle. The full thickness of the tungsten film is achieved by additional cycles with alternating reducing gases and tungsten-containing gases at one or more of the other deposition stations. This is repeated until all substrates are coated to the desired thickness. It is the sum of these individual depositions that forms the total amount of tungsten nucleation layer deposited. Any number of deposition stations, each capable of having a localized atmosphere isolated from adjacent stations, is possible within the single chamber.

The invention also provides for a deposition chamber in which alternating deposition stations are dedicated to deliver either tungsten-containing gases or reducing gases. More specifically, the deposition stations in the chamber are separated into two groups with the first group dedicated to delivery of the reducing gases and the second group for introducing tungsten-containing gas. These stations also can provide for the simultaneous delivery of carrier gases and/or hydrogen with the dedicated gases. Thus, tungsten is deposited by moving wafers from station to station such that the wafer is sequentially exposed to the reducing gases and then the tungsten-containing gases until the desired thickness of tungsten is obtained.

Figure 2A:
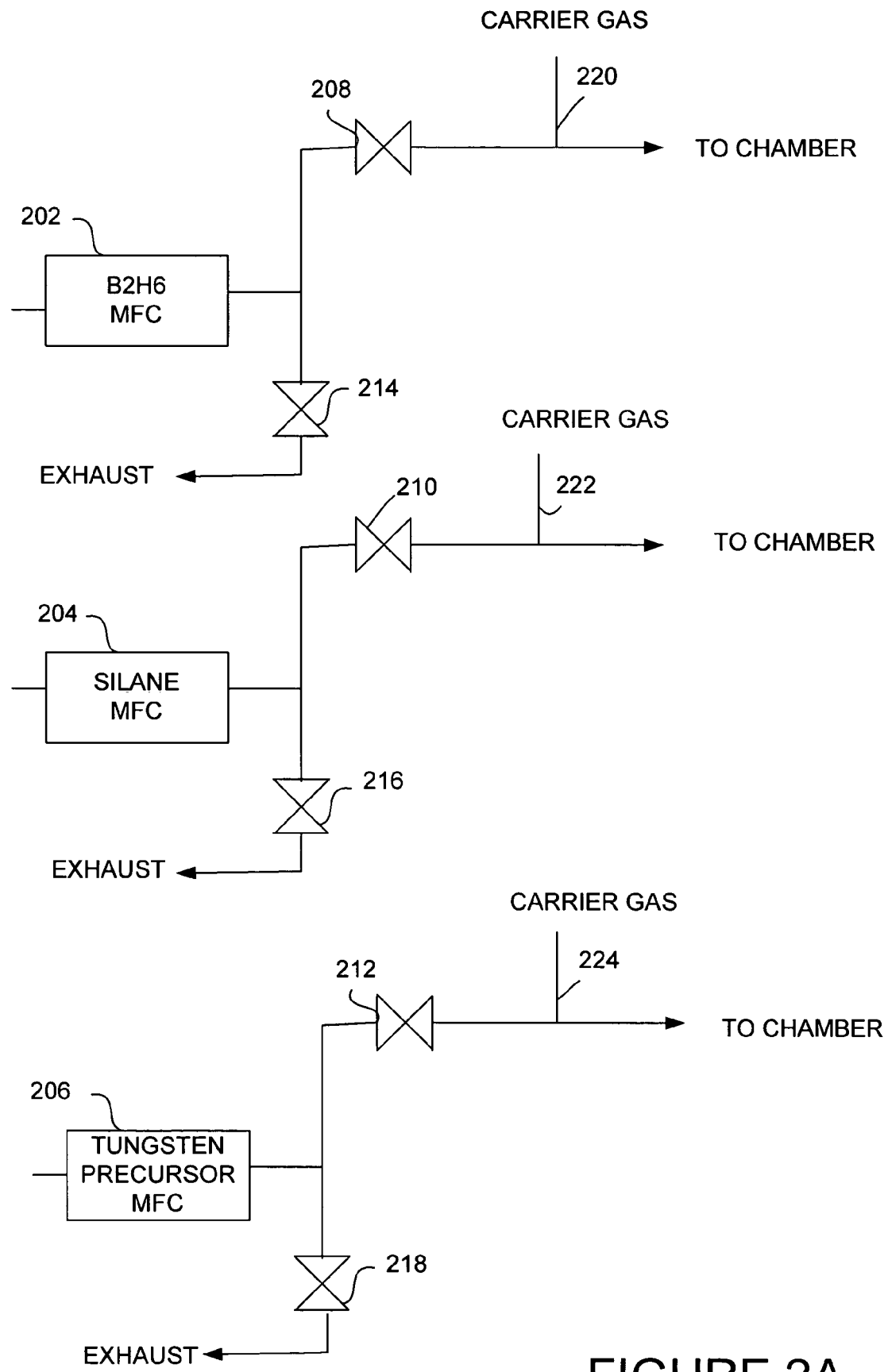
FIG. 2A is a schematic representation of a dual divert gas delivery system that may be used in accordance with the invention.
Figure 2B:
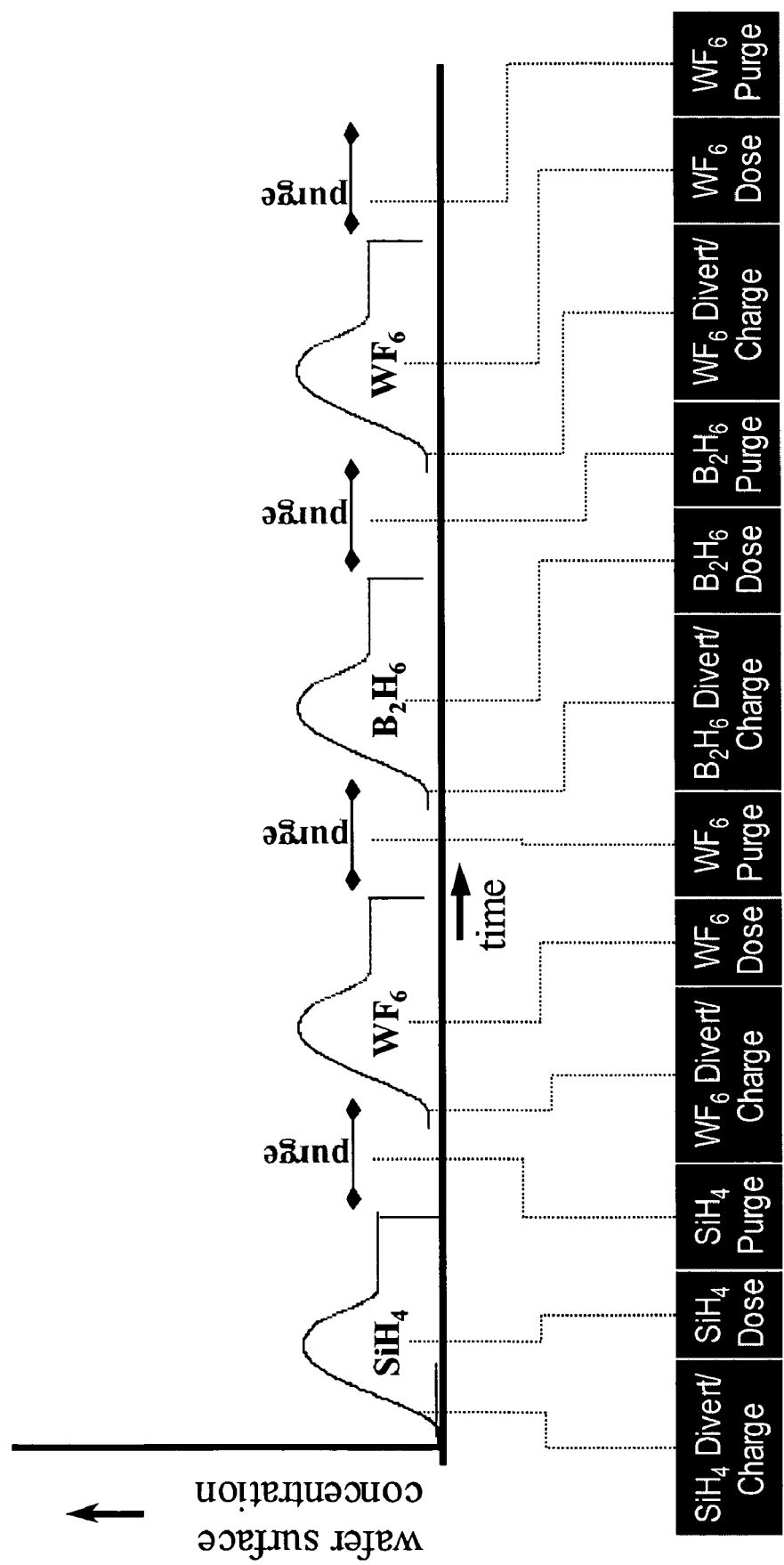
FIG. 2B is a graph representing the reactant gas surface concentration as a function of time using a dual divert gas delivery system.

The flow of reactant and purge gases may be carefully controlled to provide pulses of a desired duration, flow rate, and sequence. FIGS. 2A and 2B depict examples of a suitable apparatus and sequence respectively. As illustrated in FIG. 2A, the exemplary flow control system employs separate sources of diborane, silane, and tungsten precursor, each provided via its own mass flow controller (MFCs 202, 204, and 206, respectively). Two lines come off of the mass flow controller. One is directed to an exhaust (vacuum) and the other is directed to the reaction chamber. Each of these lines has a separate valve attached to it. The valves controlling flow to the reaction chamber are numbered 208, 210, and 212 for the diborane, silane, and tungsten precursor respectively. The valves controlling flow to exhaust are numbered, 214, 216, and 218 for the diborane, silane, and tungsten precursor respectively.

Initially in a preferred process, the flow from the mass flow controller is stabilized by opening the valve to the exhaust and allowing the gas to flow out of the system and thereby create a stable uniform flow pattern. This is sometimes referred to as a "divert" stage because the gas is actually diverted from the chamber to the exhaust. In this stage, the valve on the exhaust line is opened and the valve on the delivery line is closed. The next operation in the process involving this apparatus comprises charging a line to the chamber with the reactant in question. In this operation, the valves to both the chamber and the exhaust are closed in order to pressurize or charge the delivery line. After the line has been sufficiently charged, the valve on the line to the chamber is open and the reactant is swept into the chamber using a carrier gas such as argon or argon together with hydrogen. See carrier gas sources 220, 222, and 224 for the diborane, silane, and tungsten precursor delivery lines respectively. This is referred to as the pulse step of the process. When it is completed, the valve to the chamber is closed while the carrier gas is allowed to continue to flow. This effectively purges the chamber of the reactant.

In an alternative approach, the reactant may be delivered without the aid of a carrier gas. In this arrangement, there is a separate valve for the line providing the carrier gas. It is turned off during the pulse step so that only the reactant and no carrier gas is delivered to the chamber.

FIG. 2B depicts a pulse timeline showing how the various reaction components are delivered to the chamber/substrate in a PNL sequence in accordance with an embodiment of this invention. The vertical axis represents the concentration of the particular reactant gas in the chamber (or adsorbed on the substrate) and the horizontal axis represents time, as divided into stages associated with the various steps of the process.

As shown, the overall nucleation layer deposition process is divided into four basic pulse phases: silane, tungsten precursor, boron precursor, and tungsten precursor. Each of these pulse phases is, in turn, divided into three separate sub-stages (as provided by the apparatus described above): divert/charge, pulse, and purge.

Applications

The present invention may be used to deposit thin, low resistivity tungsten layers for many different applications. One preferred application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices. In general, the invention finds application in any environment where thin, low-resistivity tungsten layers are required.

The invention is also focuses on low resistivity, tungsten layers having relatively thin proportions, typically on the order of 500 angstroms or less, preferably, 300 angstroms or less. But more generally, the invention applies to a broader range of tungsten layers, including those with thicknesses of between about 5 angstroms to 1000 angstroms.

Another parameter of interest for many applications is a relatively low roughness of the ultimately deposited tungsten layer. Preferably, the roughness of the tungsten layer is not greater than about 10% of the total thickness of the deposited tungsten layer, and more preferably not greater than about 5% of the total thickness of the deposited tungsten layer. The roughness of a tungsten layer can be measured by various techniques such as atomic force microscopy.

Figure 3A:
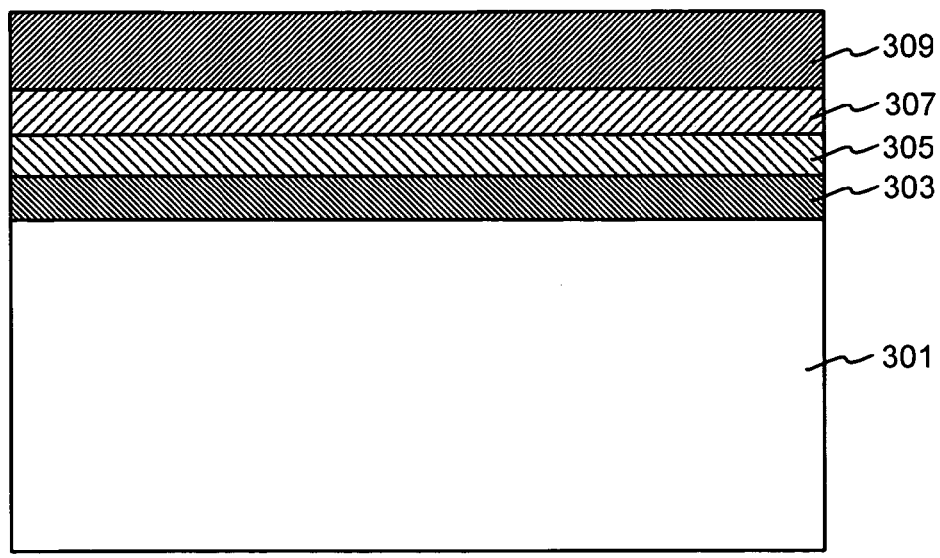
FIG. 3A is a film stack including a titanium adhesion layer together with a tungsten nucleation layer and a tungsten bulk layer formed in accordance with this invention.
Figure 3B:
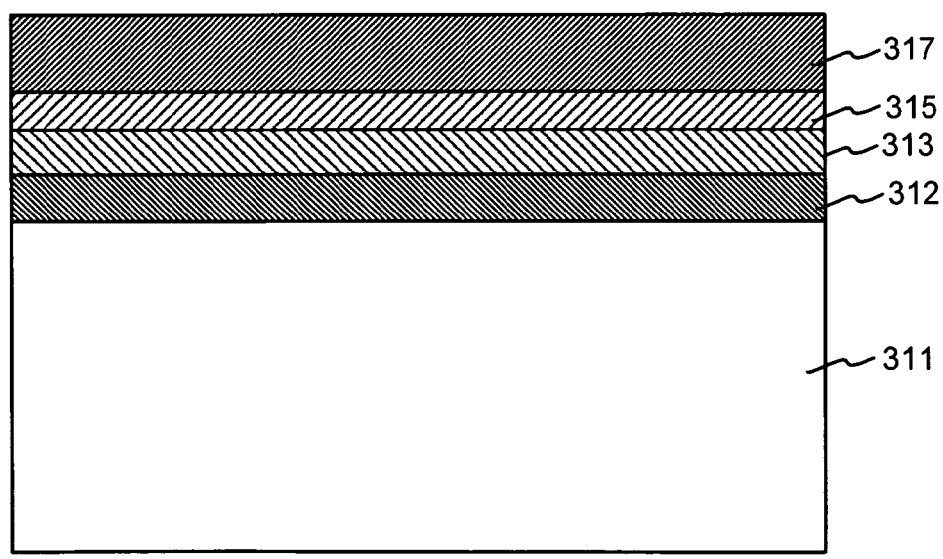
FIG. 3B is a film stack including a tungsten adhesion layer together with a tungsten nucleation layer and a tungsten bulk layer formed in accordance with this invention.

FIGS. 3A and 3B are cross-section illustrations of two different film stacks that can be formed using methods of the invention. Both film stacks may represent interconnect applications as described previously. The film stack of FIG. 3A is formed on an underlining substrate 301, which may be a single component or more commonly a complex multi-feature structure having various conductive, insulating, and semiconductor components. For example, substrate 301 may have a top layer comprising silicon or a dielectric such as silicon dioxide. Contacting substrate 301 is, in the following order, a titanium layer 303, a titanium nitride layer 305, a tungsten nucleation layer 307 (formed in accordance with this invention) and a tungsten bulk layer 309. Titanium layer 303 is typically deposited by a CVD process which provides reasonably good adhesion to the underlying substrate 301. Titanium nitride layer 305 is typically deposited using CVD or PVD methods and is used to protect the underlying titanium and/or silicon from exposure to tungsten hexafluoride ($WF_6$) during subsequent tungsten deposition. It has been found that $WF_6$ reacts very aggressively and sometimes explosively with titanium. Tungsten nucleation layer 307 and tungsten bulk layer 309 are formed in accordance with the methods of the present invention as described above. In interconnect applications as described above, layers 303, 305,307 and 309 are all etched to form interconnect lines.

The film stack of FIG. 3B is similar to that of FIG. 3A in that there is an underlining substrate 311 (comprising, for example, silicon and/or silicon dioxide), a tungsten nucleation layer 315 and a tungsten bulk layer 317. However, instead of titanium and titanium nitride layers, a tungsten layer 312 and a tungsten nitride layer 313 are employed. The nitride layer 313 is used to protect the underlying silicon from exposure to $WF_6$ and is typically deposited using a CVD or PVD process which provides reasonably good adhesion to the underlying silicon or dielectric substrate, but does not necessarily provide a sufficiently high quality layer to serve as an interconnect. As in the film stack of FIG. 3A, all the layers 312, 313, 315 and 317 are etched to form interconnect lines.

Experimental Data

Figure 4:
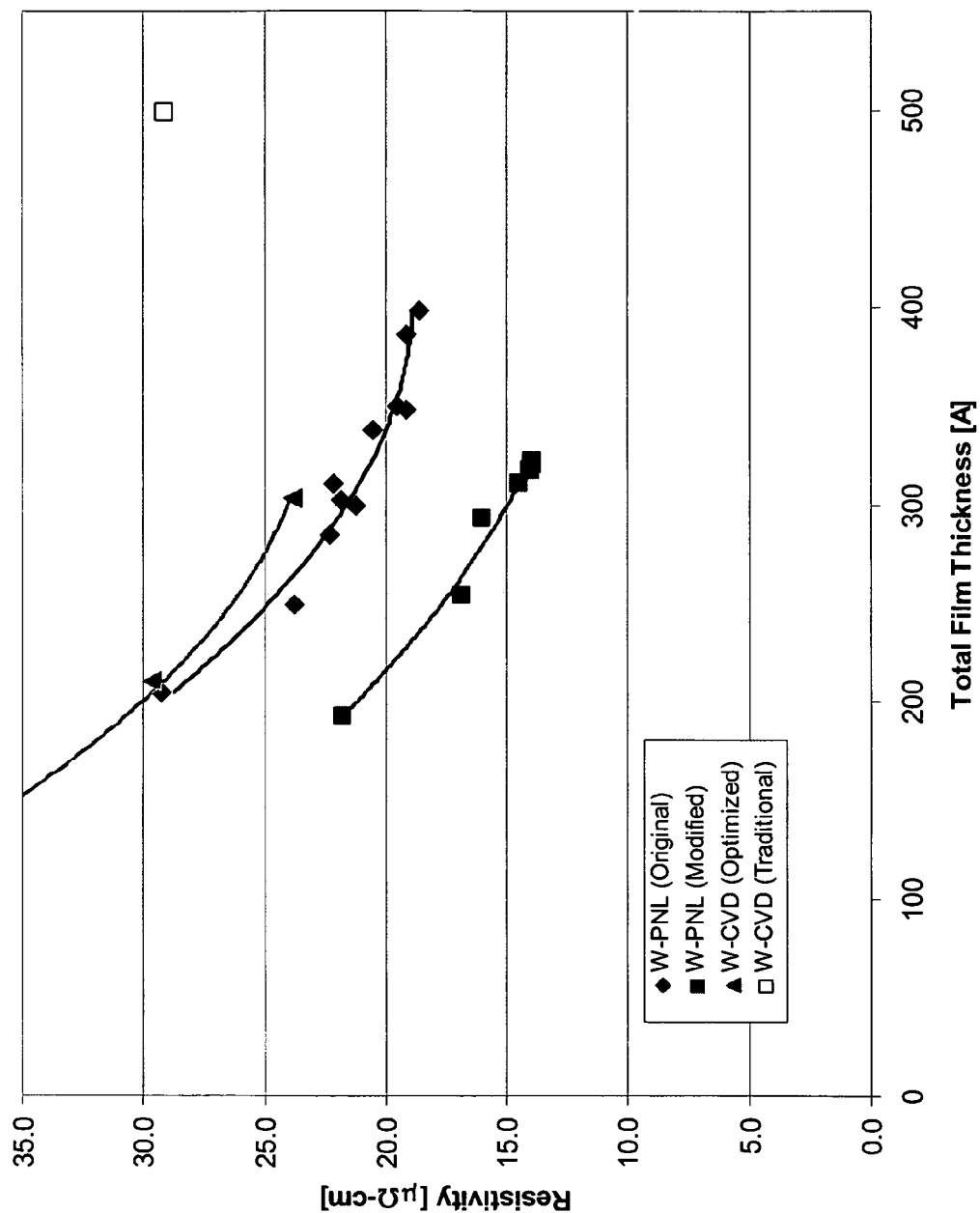
FIG. 4 is a graph comparing resistivity as a function of film thickness for different tungsten films produced by CVD and PNL and methods.

FIG. 4 shows a graph showing the resistivity as a function of film thickness for tungsten films deposited using four different types of methods. The films were deposited using "traditional W-CVD" (open rectangle symbol), "optimized W-CVD" (filled triangle symbol), "modified W-PNL" (filled rectangle symbol) and "original W-PNL" (filled diamond symbol) methods. Each film was deposited on a TiN substrate surface. For "traditional W-CVD" process, the substrate temperature was about 415 degrees Celsius. For "optimized W-CVD" process, the substrate temperatures was kept at about 415 degrees Celsius during nucleation film deposition and about 395 degrees Celsius during bulk film deposition. In the CVD films, the bulk tungsten films were deposited on intermediary tungsten nucleation layers formed by a CVD process employing tungsten hexafluoride and silane in argon and hydrogen ambient. Each data point represents a resistivity measurement of one film (i.e., one wafer) and the curved lines are best fit curves for films produced using the same methods. The resistivity of each film was measured using a four-point probe resistivity measurement tool such as an RS-35 available from KLA-Tencor or San Jose, Calif.

Both the "traditional W-CVD" film (open rectangle symbol) and "optimized W-CVD" film (filled triangle symbol) were deposited using $WF_6/SiH_4$, at pressures of about 40 Torr, for about 3 seconds to form a tungsten nucleation layer having a thickness of about 100 Angstroms each. The difference between the "traditional W-CVD" and "optimized W-CVD" films were the deposition temperature as describe above and the gas flow concentrations.

The "original W-PNL" films (filled diamond symbol) were deposited using 1 PNL cycle of $B_2H_6$—$WF_6$ and four PNL cycles of $SiH_4$—$WF_6$ at about 300 degree Celsius to form a tungsten nucleation layer having a thickness of about 30 Angstroms and subsequently deposited with bulk tungsten using a CVD method identical to that of the "W-CVD" films described above. The "modified W-PNL" films (filled rectangle symbol) were deposited using one PNL cycle of the method described in the flow chart of FIG. 1 (i.e., $B_2H_6$, $WF_6$, $SiH_4$, $WF_6$) to form a tungsten nucleation layer with a thickness of about 30 Angstroms and subsequently deposited with bulk tungsten using a CVD method similar to the "optimized W-CVD" film described above.

As shown by the graph of FIG. 4, although there was only one data point (one film) representing the "traditional W-CVD" technique, the resistivity of this film was found to be about 30 μΩ-cm for a 500 Angstrom film. Thinner films were produced using the "optimized W-CVD" methods (i.e., 200 and 300 Angstrom films) but the resistivity of these films is relatively high (i.e., about 29 μΩ-cm and about 24 μΩ-cm , respectively). The "original W-PNL" films were found to produce thin films with slightly lower overall resistivity compared to the "optimized W-CVD." For example, a 300 Angstrom film produced by "original W-PNL" has a resistivity of about 22 μΩ-cm compared to 24 μΩ-cm 300 Angstrom film produced by "optimized W-CVD." Finally, the "modified W-PNL" films of this invention had the lowest overall resistivity. For example, a 200 Angstrom film has a resistivity of about 22 μΩ-cm and a 300 Angstrom film has a resistivity of about 15 μΩ-cm.

Other Embodiments

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of forming tungsten film on a substrate in a reaction chamber, the method comprising:
   (a) positioning the substrate in the reaction chamber;
   (b) exposing the substrate to a boron-containing species to form a boron-containing layer;
   (c) contacting the boron-containing layer with a tungsten-containing precursor to form a tungsten nucleation layer;
   (d) depositing a bulk tungsten layer over the tungsten nucleation layer to form the tungsten film;
   wherein at least one of the boron-containing species and the tungsten containing precursor reactants is provided to the reaction chamber by stabilizing a flow of the reactant by diverting the flow to an exhaust port without passing through the reaction chamber; and then
   pressurizing a gas line leading to the reaction chamber by flowing the reactant to the gas line prior to allowing the reactant to enter the reaction chamber.

2. The method of claim 1, wherein the reaction chamber comprises multiple stations.

3. The method of claim 1, wherein the sheet resistance of the tungsten film is no greater than about 15 $\mu\Omega$-cm.

4. The method of claim 1, wherein the thickness of the tungsten film ranges between about 5 Angstroms and about 1,000 Angstroms.

5. The method of claim 4, wherein the thickness of the tungsten film is no greater than about 500 Angstroms.

6. The method of claim 1, wherein the thickness of the tungsten nucleation layer ranges between about 20 Angstroms and about 30 Angstroms.

7. The method of claim 1, further comprising, after (b) and before (c), and after (c) and before (d), purging the reaction chamber.

8. The method of claim 7, wherein purging the reaction chamber comprises flowing carrier gas through the reaction chamber.

9. The method of claim 8, wherein the carrier gas comprises at least one of argon, hydrogen, nitrogen and helium.

10. The method of claim 1, wherein the substrate temperature during (b) and (c) is between about 200 degrees Celsius and about 475 degrees Celsius.

11. The method of claim 1, wherein the reaction chamber pressure during (b) and (c) is between about 1 Torr and about 350 Torr.

12. The method of claim 1, wherein the boron-containing species is a borane.

13. The method of claim 12, wherein the borane is diborane ($B_2H_6$).

14. The method of claim 1 wherein the boron-containing layer formed in (b) has thickness of between about 3 and 15 Angstroms.

15. The method of claim 1, wherein the tungsten-containing precursor is at least one of $WF_6$, $WCl_6$ and $W(CO)_6$.

16. The method of claim 1 wherein (c) occurs for a time period sufficient to consume substantially all of the boron in the boron-containing layer.

17. The method of claim 1, wherein the boron-containing species flow is stabilized.

18. The method of claim 17, wherein the boron-containing species is delivered to the reaction chamber in (b) in a dilution gas comprising at least one of argon, hydrogen, nitrogen, helium and silane.

19. The method of claim 1, wherein the tungsten-containing precursor flow is stabilized.

20. The method of claim 19, wherein the tungsten-containing precursor is delivered to the reaction chamber in (b) in a dilution gas comprising at least one of argon, hydrogen, nitrogen, and helium.

21. The method of claim 1, wherein (d) involves using a CVD process.

22. A method of forming tungsten film on a substrate in a reaction chamber, the method comprising the following sequence:
   (a) positioning the substrate in the reaction chamber;
   (b) exposing the substrate to a silane;
   (c) contacting the substrate with a tungsten-containing precursor to form a portion of the tungsten nucleation layer;
   (d) exposing the substrate to a boron-containing species to form a boron-containing layer;
   (e) contacting the boron-containing layer with a second tungsten-containing precursor to form a tungsten nucleation layer; and
   (f) depositing a bulk tungsten layer over the tungsten nucleation layer to form the tungsten film.

23. The method of claim 22, wherein the second tungsten-containing precursor is the same chemical compound as the tungsten-containing precursor in (e).

24. The method of claim 22, further comprising repeating exposing the substrate to the silane and contacting the substrate with the tungsten-containing precursor.

25. The method of claim 22, further comprising after contacting the substrate with a tungsten-containing precursor to form a portion of the tungsten nucleation layer and before (d), purging the reaction chamber.

26. The method of claim 22, wherein the substrate temperature during exposing the substrate to a silane and contacting the substrate with a tungsten-containing precursor is between about 200 degrees Celsius and about 475 degrees Celsius.

27. The method of claim 22, wherein the reaction chamber pressure during exposing the substrate to a silane and contacting the substrate with a tungsten-containing precursor is between about 1 Torr and about 350 Torr.

28. The method of claim 22, wherein the silane comprises at least one of $SiH_4$, disilane, and tetrasilane.

29. The method of claim 22, further comprising, prior to exposing the substrate to a silane,
   stabilizing a flow of the silane by diverting the flow to an exhaust port without passing through the reaction chamber; and then
   pressurizing a gas line leading to the reaction chamber by flowing the silane to the gas line prior to allowing the silane to enter the reaction chamber.

30. The method of claim 29, wherein the silane is delivered to the reaction chamber in a dilution gas comprising at least one of argon, hydrogen, nitrogen, and helium.

31. The method of claim 22, further comprising, prior to contacting the substrate with a tungsten-containing precursor,
   stabilizing a flow of the second tungsten-containing precursor by diverting the flow to an exhaust port without passing through the reaction chamber; and then
   pressurizing a gas line leading to the reaction chamber by flowing the second tungsten-containing precursor to the gas line prior to allowing the second tungsten-containing precursor to enter the reaction chamber.

32. The method of claim 31, wherein the tungsten-containing precursor is delivered to the reaction chamber in a dilution gas comprising at least one of argon, hydrogen, nitrogen, and helium.

* * * * *